(12) United States Patent
Shen et al.

(10) Patent No.: US 10,825,845 B2
(45) Date of Patent: Nov. 3, 2020

(54) DISPLAY PANEL HAVING A PLURALITY OF SPACERS

(71) Applicant: Au Optronics Corporation, Hsinchu (TW)

(72) Inventors: Meng-Wei Shen, Kaohsiung (TW); Yung-Cheng Yeh, Chiayi County (TW)

(73) Assignee: Au Optronics Corporation, Hsinchu (TW)

( * ) Notice: Subject to any disclaimer, the term of this patent is extended or adjusted under 35 U.S.C. 154(b) by 148 days.

(21) Appl. No.: 16/056,553

(22) Filed: Aug. 7, 2018

(65) Prior Publication Data

US 2019/0043895 A1 Feb. 7, 2019

(30) Foreign Application Priority Data

Aug. 7, 2017 (TW) .............................. 106126602 A

(51) Int. Cl.
| | |
|---|---|
| *G06F 3/045* | (2006.01) |
| *H01L 27/12* | (2006.01) |
| *H01L 29/786* | (2006.01) |
| *G06F 3/044* | (2006.01) |
| *G06F 3/041* | (2006.01) |

(Continued)

(52) U.S. Cl.
CPC ...... *H01L 27/1248* (2013.01); *G02F 1/13394* (2013.01); *G06F 3/044* (2013.01); *G06F 3/0412* (2013.01); *H01L 27/124* (2013.01); *H01L 29/78633* (2013.01); *G02F 1/1368* (2013.01); *G02F 1/13338* (2013.01); *G02F 1/136209* (2013.01); *G02F 1/136286* (2013.01); *G02F 2001/13396* (2013.01); *G02F 2001/13398* (2013.01); *G02F 2001/134372* (2013.01);

(Continued)

(58) Field of Classification Search
CPC ............. H01L 27/1248; G02F 1/13394; G06F 3/0412; G06F 3/044
USPC ........................................................ 345/174
See application file for complete search history.

(56) References Cited

U.S. PATENT DOCUMENTS

| 8,872,184 B2 | 10/2014 | Chen et al. |
|---|---|---|
| 9,224,765 B2 | 12/2015 | Chen et al. |

(Continued)

FOREIGN PATENT DOCUMENTS

| CN | 101692141 | 4/2010 |
|---|---|---|
| CN | 103901672 | 7/2014 |

(Continued)

*Primary Examiner* — Jonathan M Blancha
(74) *Attorney, Agent, or Firm* — JCIPRNET

(57) ABSTRACT

A display panel including a first substrate, an active element layer, a pixel electrode layer, an auxiliary conductive layer, a first spacer and a second spacer is provided. The active element layer is disposed on the first substrate. The pixel electrode layer is disposed on the first substrate and electrically connected with the active element layer. The auxiliary conductive layer is disposed on the active element layer. The first spacer is disposed on the auxiliary conductive layer. The first spacer overlaps the auxiliary conductive layer in a normal projection direction. The second spacer is disposed on the active element layer. The second spacer does not overlap the auxiliary conductive layer in the normal projection direction. A distance between an apex of the first spacer and the first substrate is longer than a distance between an apex of the second spacer and the first substrate.

19 Claims, 9 Drawing Sheets

(51) Int. Cl.
*G02F 1/1339* (2006.01)
*G02F 1/1368* (2006.01)
*G02F 1/1362* (2006.01)
*G02F 1/1333* (2006.01)
*G02F 1/1343* (2006.01)

(52) U.S. Cl.
CPC ............ *G02F 2001/136218* (2013.01); *G02F 2001/136222* (2013.01); *G06F 2203/04103* (2013.01)

(56) References Cited

U.S. PATENT DOCUMENTS

| | | |
|---|---|---|
| 2011/0073862 A1 | 3/2011 | Chen et al. |
| 2014/0160066 A1 | 6/2014 | Kim et al. |
| 2014/0232971 A1* | 8/2014 | Kubota ............... G02F 1/13439 349/110 |
| 2015/0011054 A1 | 1/2015 | Chen et al. |
| 2015/0160519 A1* | 6/2015 | Cho ...................... G02F 1/1339 349/138 |
| 2016/0195749 A1* | 7/2016 | Um ..................... G02F 1/13394 349/110 |
| 2016/0291746 A1* | 10/2016 | Kim ...................... G06F 3/0416 |
| 2016/0291750 A1 | 10/2016 | Chai et al. |
| 2017/0184931 A1* | 6/2017 | Zhang ............... G02F 1/133345 |

FOREIGN PATENT DOCUMENTS

| | | |
|---|---|---|
| CN | 104698709 | 6/2015 |
| CN | 104730777 | 6/2015 |
| TW | I418903 | 12/2013 |

* cited by examiner

DISPLAY PANEL HAVING A PLURALITY OF SPACERS

CROSS-REFERENCE TO RELATED APPLICATION

This application claims the priority benefit of Taiwan application serial no. 106126602, filed on Aug. 7, 2017. The entirety of the above-mentioned patent application is hereby incorporated by reference herein and made a part of this specification.

BACKGROUND

Field of the Invention

The invention is directed to an electronic apparatus and more particularly, to a display panel.

Description of Related Art

A conventional display panel is formed by a color filter substrate, a pixel array substrate and a display medium disposed between the color filter substrate and the pixel array substrate. Generally speaking, a color filter substrate includes a black matrix layer. The black matrix layer is used to shield a region between adjacent sub-pixel regions to prevent light leakage of the display panel. Additionally, in order to keep a certain cell space between the color filter substrate and the pixel array substrate, a plurality of spacers are disposed between the color filter substrate and the pixel array substrate. The spacers are usually formed on the color filter substrate and based on the consideration of increasing pressure resistance, the spacers include a main spacer having a higher height and a sub spacer having a lower height.

In a fabrication process of the display panel, the color filter substrate and the pixel array substrate have to be assembled to each other. When alignment between the color filter substrate and the pixel array substrate is poor, the black matrix layer of the color filter substrate cannot well shield the region between the adjacent sub-pixel regions of the pixel array substrate, and the spacers may also fail to be disposed correctly, which results in the light leakage. Thus, in another fabrication process of the display panel, the black matrix layer and the spacers are both formed on the pixel array substrate to prevent the aforementioned light leakage issue caused by the poor alignment between the two substrates. Based on the consideration of simplifying the fabrication process, a patterned black photoresist material layer with a tri-tone photo mask is used to simultaneously form a black matrix layer, a main spacer and a sub spacer which respectively have three kinds of heights on the pixel array substrate. However, at present, the fabrication process using the tri-tone photo mask and the black photoresist material is still under development, which cannot stably fabricate the black matrix layer, the main spacer and the sub spacer with height difference thereamong within a tolerable range, which leads to difficulty in mass production of the display panel.

SUMMARY

The invention provides a display panel which can be subject to mass production.

A display panel of the invention includes a first substrate, an active element layer, a pixel electrode layer, an auxiliary conductive layer, a first spacer and a second spacer. The active element layer is disposed on the first substrate. The pixel electrode layer is disposed on the first substrate and electrically connected with the active element layer. The auxiliary conductive layer is disposed on the active element layer. The first spacer is disposed on the auxiliary conductive layer. The first spacer overlaps the auxiliary conductive layer in a normal projection direction. The second spacer is disposed on the active element layer. The second spacer does not overlap the auxiliary conductive layer in the normal projection direction. A distance between an apex of the first spacer and the first substrate is greater than a distance between an apex of the second spacer and the first substrate.

Based on the above, in the display panel according to one of the embodiments of the invention, the first spacer is disposed on the auxiliary conductive layer, and the second spacer is not disposed on the auxiliary conductive layer. Thereby, even though the first spacer and the second spacer having substantially the same height are formed on the first substrate by using a mature fabrication process, the distance between the apex of the first spacer and the first substrate is still greater than a distance between the apex of the second spacer and the first substrate. A stacking structure of the first spacer and the auxiliary conductive layer can be considered as the main spacer for maintaining the cell gap, and the second spacer may be considered as the sub spacer. Because the fabrication process of forming the auxiliary conductive layer, the first spacer and the second spacer is mature and stable, the display panel can be subject to mass production.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
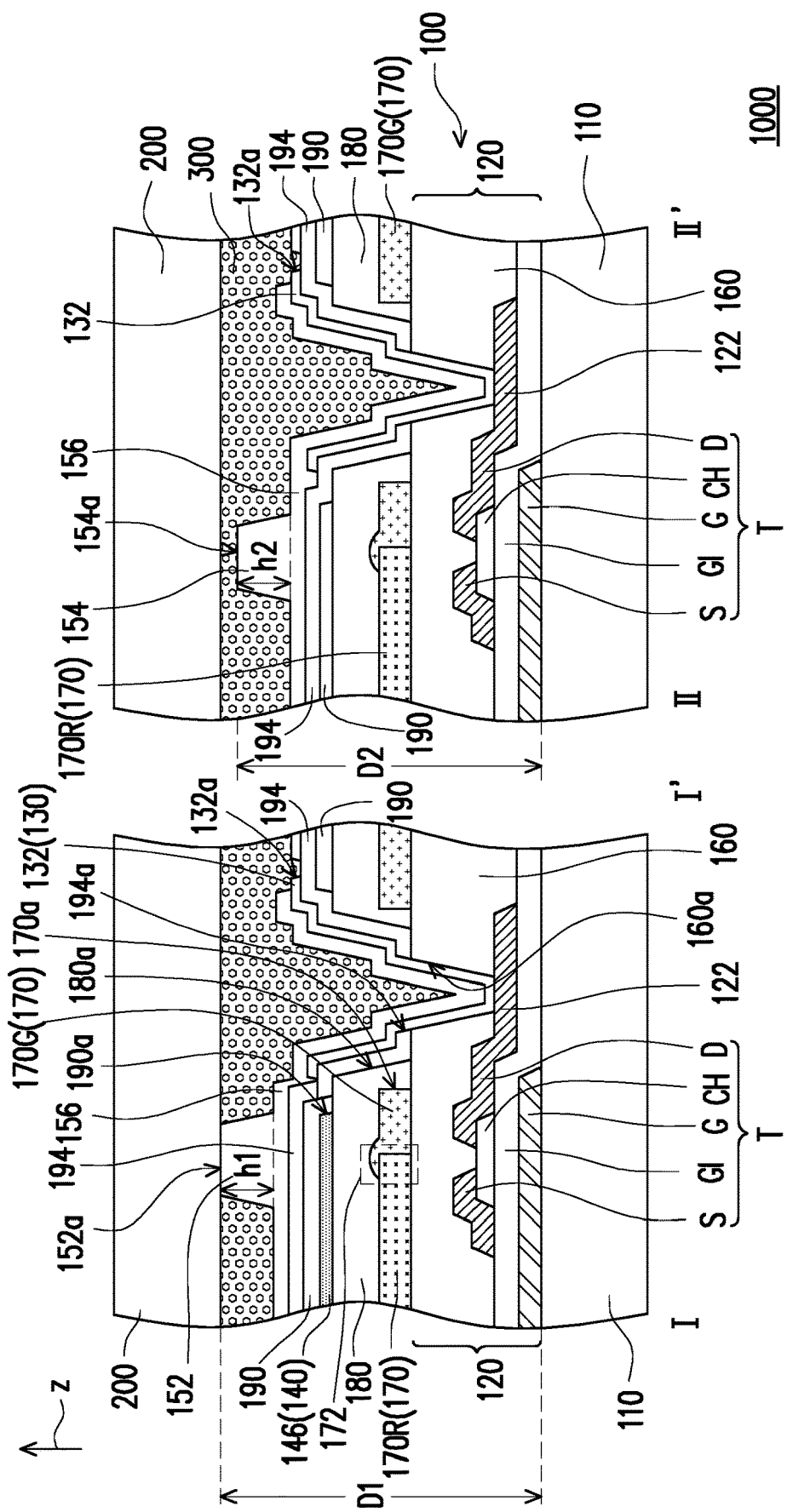
FIG. 1 is a schematic cross-sectional view of a display panel according to an embodiment of the invention.
Figure 2:
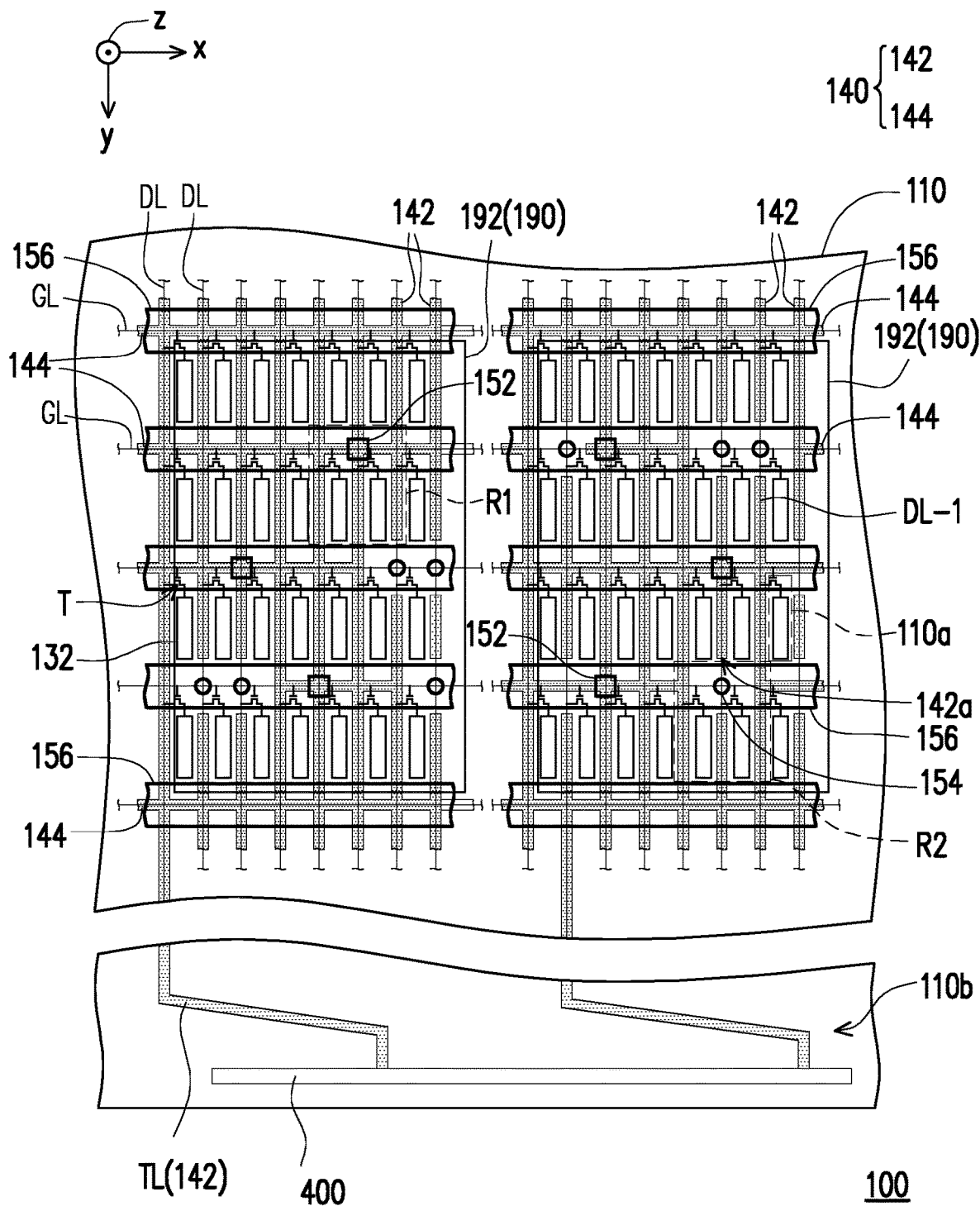
FIG. 2 is a schematic top view of a pixel array substrate illustrated in FIG. 1.
Figure 3:
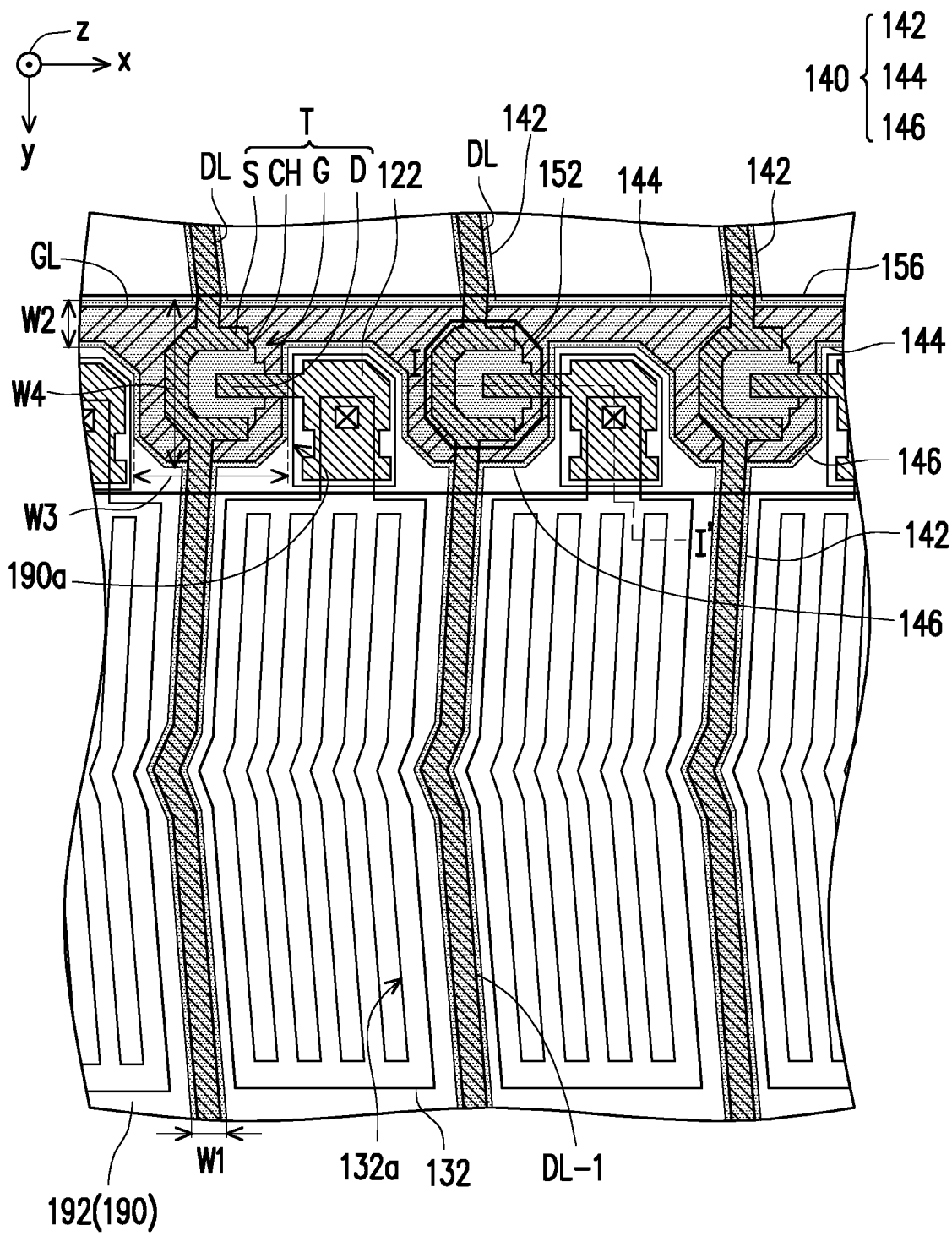
FIG. 3 is a schematic top view of a layout of a part of the pixel array substrate according to an embodiment of the invention.
Figure 4:
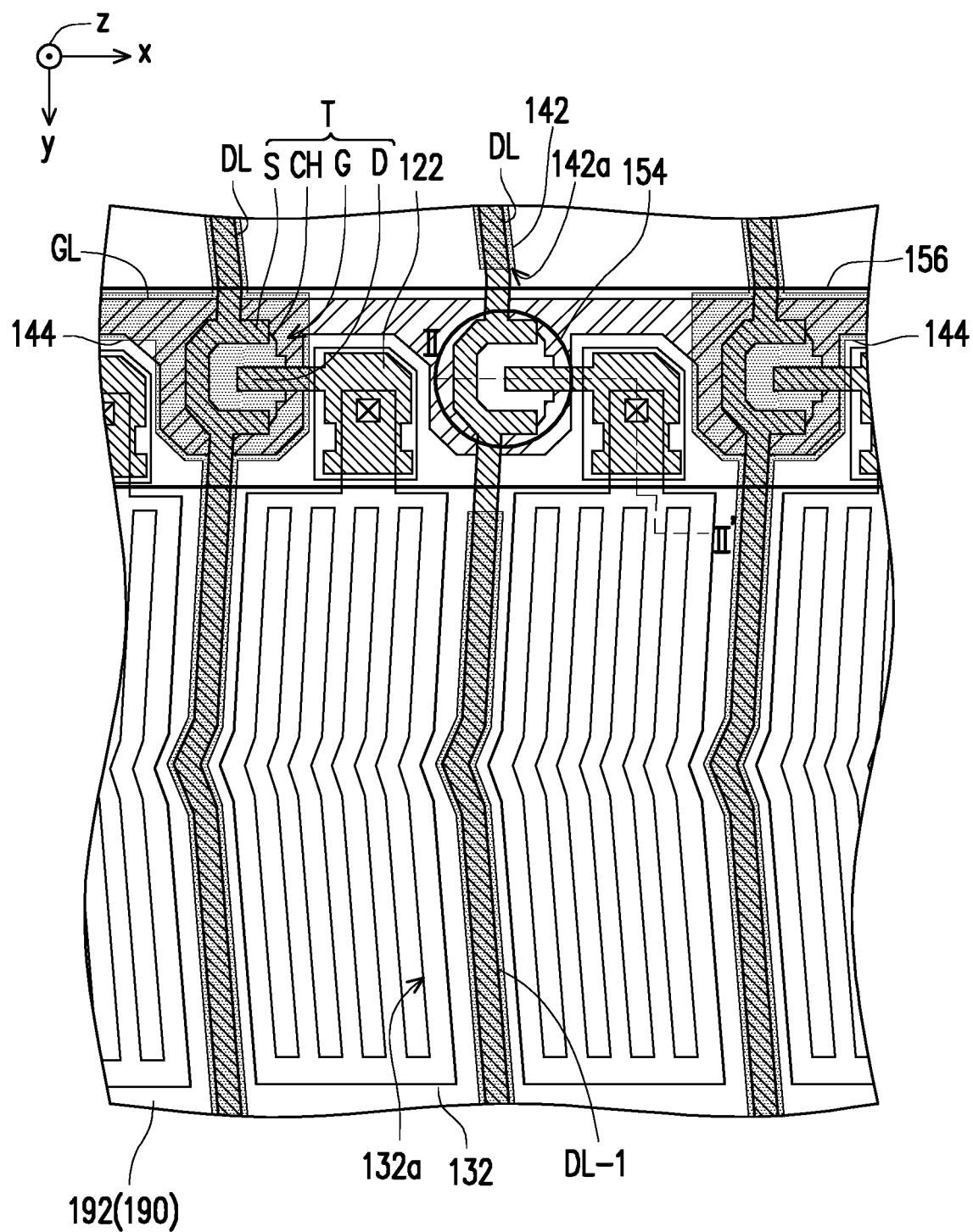
FIG. 4 is a schematic top view of a layout of a part of the pixel array substrate according to an embodiment of the invention.

FIG. 1 is a schematic cross-sectional view of a display panel according to an embodiment of the invention. FIG. 2 is a schematic top view of a pixel array substrate illustrated in FIG. 1. For the sake of clarity, the illustration of a color filter layer 170 depicted in FIG. 1 is omitted in FIG. 2, and a part of the components (e.g., active elements T) are illustrated in a circuitry manner. FIG. 3 is a schematic top view of a layout of a part of the pixel array substrate according to an embodiment of the invention. Specially, FIG. 3 corresponds to a region R1 in FIG. 2 where a first spacer 152 is located, and FIG. 1 shows a schematic cross-sectional view along line I-I' of FIG.3. FIG. 4 is a schematic top view of a layout of a part of the pixel array substrate according to an embodiment of the invention. Specially, FIG. 4 corresponds to a region R2 in FIG. 2 where a second spacer 154 is located, and FIG. 1 shows a schematic cross-sectional view along line II II' of FIG.4.

Referring to FIG. 1, in the present embodiment, a display panel 1000 includes a pixel array substrate 100, a second substrate 200 and a display medium 300. The pixel array substrate 100 includes a first substrate 110, the second substrate 200 is disposed opposite to the first substrate 110, and the display medium 300 is located between the first substrate 110 and the second substrate 200. In the present embodiment, the display medium 300 is, for example, liquid crystal. However, the invention is not limited thereto, and in other embodiments, the display medium 300 may also be an organic light-emitting diode (OLED) or other suitable materials. In the present embodiment, both the first substrate 110 and the second substrate 200 may be transparent substrates. However, the invention is not limited thereto, and in other embodiments, the first substrate 110 may be an opaque/reflective substrate, and the second substrate 200 may be a transparent substrate. For example, a material of the aforementioned transparent substrate may include glass, quartz, an organic polymer or other suitable materials, and a material of the aforementioned opaque/reflective substrate may include a conductive material, a wafer, ceramics or other suitable materials, but the invention is not limited thereto.

Referring to FIG. 1 and FIG. 2, the pixel array substrate 100 includes an active element layer 120. The active element layer 120 is disposed on the first substrate 110. In the present embodiment, the active element layer 120 includes a plurality of active elements T, a plurality of data lines DL, a plurality of scan lines GL and an insulation layer 160. For example, in the present embodiment, the active elements T may be thin film transistors (TFTs). Each TFT has a gate G, a semiconductor layer CH, an insulation layer GI located between the semiconductor layer CH and the gate G, a source S and a drain D respectively electrically connected with two different regions of the semiconductor layer CH. To be specific, as illustrated in FIG. 1, in the present embodiment, the gate G may be located under the semiconductor layer CH, the active elements T may be bottom gate TFTs. However, the invention is not limited thereto, and in other embodiments, the active elements T may also be top gate TFTs or other suitable TFT types.

The data lines DL and the scan lines GL intersect with each other. The data lines DL and the scan lines GL are electrically connected with the active elements T. To be specific, in the present embodiment, the data lines DL are electrically connected with the sources S of the active elements T, and the scan lines GL are electrically connected with the gates G of the active elements T. For example, in the present embodiment, the scan lines GL and the gates G may be together formed on a first conductive layer, and the data lines DL, the sources S and the drains D may be together formed on a second conductive layer, but the invention is not limited thereto. Based on the consideration of conductivity, the scan lines GL and the data lines DL are generally made of a metal material, but the invention is not limited thereto. In other embodiments, the scan lines GL and the data lines DL may also be made of other conductive materials, for example, an alloy, a metal nitride material, a metal oxide material, a metal oxynitride material, other suitable materials or a stacking layer consisting a metal material and other conductive materials.

In the present embodiment, the insulation layer 160 may cover the active elements T, the data lines DL and the scan lines GL. For example, in the present embodiment, a material of the insulation layer 160 may include an inorganic material (e.g., silicon oxide, silicon nitride, silicon oxynitride, other suitable materials, or a stacking layer consisting of at least two of the aforementioned materials), an organic material (e.g., polyester, polyolefin, polyacrylamide, polycarbonate, polyoxyalkylene, polyphenol, polyether, polyketone, polyol, polyaldehyde, other suitable materials, or a combination of the aforementioned materials), other suitable materials, or a combination of the aforementioned materials.

Referring to FIG. 1, in the present embodiment, the pixel array substrate 100 may selectively include a color filter layer 170. For example, in the present embodiment, the color filter layer 170 may be disposed on the insulation layer 160 above the active elements T, but the invention is not limited thereto. In the present embodiment, the color filter layer 170 includes a plurality of color filter patterns 170R and 170G. The color filter patterns 170R and 170G are respectively disposed in a plurality of sub-pixel regions 110a (which are illustrated in FIG. 2) of the first substrate 110. Referring to FIG. 2, in the present embodiment, each of the sub-pixel regions 110a may be a region surrounded by two adjacent data lines DL and two adjacent scan lines GL, but the invention is not limited thereto. Referring to FIG. 1, in the present embodiment, the two color filter patterns 170R and 170G which are adjacent to each other and have different colors may partially overlap with each other. An overlapping portion 172 of the color filter pattern 170R and the color filter pattern 170G may be located above the data lines DL. In other words, the overlapping portion 172 of the adjacent color filter patterns 170R and 170G may shield a region between two adjacent pixel electrodes 132, so as to improve the light leakage issue, but the invention is not limited thereto.

Referring to FIG. 1, in the present embodiment, the pixel array substrate 100 may also include an insulation layer 180. The insulation layer 180 covers the color filter layer 170. For example, in the present embodiment, a material of the insulation layer 180 may include an inorganic (e.g., silicon oxide, silicon nitride, silicon oxynitride, other suitable materials or a stacking layer consisting of at least two of the aforementioned materials), an organic material (e.g., polyester, polyolefin, polyacrylamide, polycarbonate, polyoxyalkylene, polyphenol, polyether, polyketone, polyol, polyaldehyde, other suitable materials, or a combination of the aforementioned materials), other applicable materials, or a combination of the aforementioned materials.

Referring to FIG. 1, the auxiliary conductive layer 140 is disposed above the active element layer 120. To be specific, in the present embodiment, the auxiliary conductive layer 140 may cover the insulation layer 180 on the color filter layer 170, but the invention is not limited thereto. Referring to FIG. 1 to FIG. 4, in the present embodiment, the auxiliary conductive layer 140 may include a plurality of first extension portions 142 and a plurality of second extension portions 144, the first extension portions 142 overlap the data lines DL in a normal projection direction z, and the second extension portions 144 overlap the scan lines GL in the normal projection direction z. Furthermore, in the present embodiment, the auxiliary conductive layer 140 may also include third extension portions 146 (which are illustrated in FIG. 3 and FIG. 4), and the third extension portions 146 overlap the active elements T in the normal projection direction z. The third extension portions 146 are connected with the first extension portions 142 and the second extension portions 144 and located at the intersections of the first extension portions 142 and the second extension portions 144. Referring to FIG. 3, a width W3 of the third extension portions 146 in an extension direction x of the scan lines GL may be greater than a width W1 of the first extension portions 142 in the extension direction x of the scan lines GL. A direction y is perpendicular to the extension direction x of the scan lines GL and perpendicular to the normal projection direction z. A width W4 of the third extension portions 146 in the direction y may be greater than a width W2 of the second extension portions 144 in the direction y. Referring to FIG. 2, in general, in the present embodiment, the auxiliary conductive layer 140 may substantially form a mesh pattern. A plurality of meshes of the mesh pattern respectively overlap the sub-pixel regions 110a, and networks of the mesh pattern are disconnected at a place where the second spacer 154 is disposed, but not disconnected at a place where the first spacer 152 is disposed.

Referring to FIG. 2, FIG. 3 and FIG. 4, for example, in the present embodiment, the auxiliary conductive layer 140 may be a light-shielding conductive layer. In other words, in the present embodiment, the first extension portions 142, the second extension portions 144 and the third extension portions 146 are all capable of shielding light. The first extension portions 142 may shield regions, where the data lines DL cross, between the adjacent sub-pixel regions 110a in the direction x, the second extension portions 144 may shield regions, where the scan lines GL cross, between the adjacent sub-pixel regions 110a in the direction y, and the third extension portions 146 (which are illustrated in FIG. 3 and FIG. 4) may shield regions where the active elements T and the first spacer 152 are located, thereby preventing light leakage of the display panel 1000. In brief, in the present embodiment, the auxiliary conductive layer 140 may substitute for a part of functions of the black matrix of the conventional black matrix on array (BOA) structure. Specially, the first extension portions 142 of the auxiliary conductive layer 140 may substitute for the function of the longitudinal portions of the conventional BOA structure. In the present embodiment, a material of the auxiliary conductive layer 140 includes, for example, a metal, an alloy, a metal nitride material, a metal oxide material, a metal oxynitride material, other suitable materials, a stacking layer of the metal material and other conductive materials or a combination of at least two of the aforementioned materials. For example, the material of the auxiliary conductive layer 140 may include molybdenum silicide (MoSi), molybdenum nitride (MoSiN), molybdenum silicon oxide (MoSiO), molybdenum silicon carbide (MoSiC), molybdenum silicon carbon oxide (MoSiCO), molybdenum silicon carbonitride (MoSiCN), molybdenum silicon oxynitride (MoSiON) molybdenum (Mo), tantalum (Ta) molybdenum nitride (MoN), aluminum (Al), copper (Cu), titanium (Ti), platinum (Pt), tungsten (W), indium tin oxide (ITO), indium zinc oxide (IZO), zinc oxide (ZnO), other suitable materials or a combination of at least two of the aforementioned materials, and may preferably include molybdenum (Mo), aluminum (Al), copper (Cu), molybdenum nitride (MoN), titanium (Ti) or a combination of at least two of the aforementioned materials.

However, the invention is not intent to limit that the auxiliary conductive layer 140 must be the light-shielding conductive layer, and in other embodiments, the auxiliary conductive layer 140 may also be a transparent conductive layer, while the light leakage may be prevented from occurring to the display panel 1000 by using other components. For example, the light leakage may be prevented from occurring to the display panel 1000 by means of the overlapping portion 172 of the color filter patterns 170R and 170G shielding the regions, where the data lines DL cross, between adjacent sub-pixel regions 110a in the direction x, by means of the light-shielding pattern layer 156 shielding the regions, wherein the scan lines GL cross, between adjacent sub-pixel regions 110a in the direction y, or the regions where the active elements T, the first spacer 152, the second spacer 154 and openings 190a are located. For example, a material of the transparent conductive layer may include a metal oxide material, such as ITO, IZO, aluminum tin oxide (ATO), aluminum zinc oxide (AZO), Indium Gallium Zinc Oxide (IGZO), other suitable oxides or a stacking layer consisting at least two of the aforementioned materials, but the invention is not limited thereto.

Referring to FIG. 1, in the present embodiment, the pixel array substrate 100 may selectively include a common electrode layer 190. A plurality of portions of the common electrode layer 190 respectively overlapping the pixel electrodes 132 may be considered as a plurality of common electrodes. The common electrode layer 190 is disposed over the first substrate 110. For example, in the present embodiment, the auxiliary conductive layer 140 may be located between the common electrode layer 190 and the active element layer 120. Furthermore, in the present embodiment, the common electrode layer 190 may be disposed above the insulation layer 180 and the auxiliary conductive layer 140. The common electrode layer 190 may directly cover the auxiliary conductive layer 140, so as to be electrically connected with the auxiliary conductive layer 140. However, the invention is not limited thereto, and in other embodiments, the common electrode layer 190 may also be electrically connected with the auxiliary conductive layer 140 in other adaptive manners. Additionally, in the present embodiment, the common electrode layer 190 has the openings 190a, and the active element layer 120 may also include connection portions 122 electrically connected with the drains D of the active elements T, where the openings 190a of the common electrode layer 190 overlap the connection portions 122 in the normal projection direction z. In the present embodiment, the common electrode layer 190 may be, for example, a transparent conductive layer. A material of the transparent conductive layer may include such as ITO, IZO, ATO, AZO, IGZO, other suitable oxides or a stacking layer consisting at least two of the aforementioned materials, but the invention is not limited thereto.

Referring to FIG. 1 and FIG. 2, in the present embodiment, the common electrode layer 190, besides serving as a common electrode layer for displaying, may also selectively serve as a touch electrode layer for touch controlling. As illustrated in FIG. 2, the common electrode layer 190 has a plurality of touch sensing pads 192 which are separated from one another. Each of the touch sensing pads 192 overlaps the pixel electrodes 132 in the normal projection direction z. When the display panel 1000 is operated in a touch mode (or referred to as in a touch period), and if an object (e.g., a finger or a stylus) touches the display panel 1000, a capacitive coupling effect is formed between the object and the touch sensing pads 192, thereby generating a capacitance change. A touched position of the object may be determined by detecting the capacitance change, so as to achieve a touch function.

Referring to FIG. 2, it is to be noted that in the present embodiment, the auxiliary conductive layer 140 (which is illustrated in FIG. 1 and FIG. 3) may be electrically connected with the common electrode layer 190 serving as the touch electrode layer, and a part of the auxiliary conductive layer 140 may serve as touch lines TL. Each of the touch lines TL is electrically connected between a corresponding touch sensing pad 192 and a touch driving unit 400. To be specific, in the present embodiment, each of the touch sensing pads 192 may directly cover multiple of the first extension portions 142, multiple of the second extension portions 144 and multiple of the third extension portions 146 of the auxiliary conductive layer 140, so as to be electrically connected with the first extension portions 142, the second extension portions 144 and the third extension portions 146. At least one of the first extension portions 142 which overlaps one of the touch sensing pads 192 may be extended out of an area of the touch sensing pad 192, so as to be electrically connected with the touch driving unit 400, and the at least one of the first extension portions 142 may be considered as a touch line TL. However, the invention is not limited thereto, and in other embodiments, the common electrode layer 190 may also not serve as a touch electrode layer, and/or the auxiliary conductive layer 140 may also not include the touch lines TL electrically connected between the touch sensing pads 192 and the touch driving unit 400. In the present embodiment, the first substrate 110 has a plurality of peripheral regions 110b outside the sub-pixel regions 110a, and the touch driving unit 400 is, for example, an integrated circuit (IC) bonded on the peripheral regions 110b, but the invention is not limited thereto. In other embodiments, the touch driving unit 400 may also be a component located outside the display panel 1000.

Referring to FIG. 1, in the present embodiment, the pixel array substrate 100 may selectively include an insulation layer 194. The insulation layer 194 is disposed between a pixel electrode layer 130 and the common electrode layer 190. For example, in the present embodiment, the insulation layer 194 may cover the common electrode layer 190, and the pixel electrode layer 130 may be disposed on the insulation layer 194, but the invention is not limited thereto. For example, in the present embodiment, a material of the insulation layer 194 may include an inorganic (e.g., silicon oxide, silicon nitride, silicon oxynitride, other suitable materials or a stacking layer consisting of at least two of the aforementioned materials), an organic material (e.g., polyester, polyolefin, polyacrylamide, polycarbonate, polyoxyalkylene, polyphenol, polyether, polyketone, polyol, polyaldehyde, other suitable materials or a combination of the aforementioned materials), other suitable materials or a combination of the aforementioned materials.

Referring to FIG. 1 to FIG. 4, the pixel array substrate 100 includes the pixel electrode layer 130. The pixel electrode layer 130 has a plurality of pixel electrodes 132 which are separated from one another. The pixel electrode layer 130 is disposed on the first substrate 110 and electrically connected with the active elements T. For example, as illustrated in FIG. 1, in the present embodiment, the insulation layer 194, the common electrode layer 190, the insulation layer 180, the color filter layer 170 and the insulation layer 160 respectively have openings 194a, 190a, 180a, 170a and 160a overlapping the connection portions 122, and the pixel electrodes 132 may be filled in the openings 194a, 190a, 180a, 170a and 160a, so as to electrically contact the connection portions 122. In this way, the pixel electrodes 132 may be electrically connected with the drains D of the active elements T through the connection portions 122.

Referring to FIG. 1 and FIG. 3, in the present embodiment, the pixel electrode 132 or its corresponding common electrode layer 190 (or the touch sensing pads 192) has a plurality of openings 132a in each of the sub-pixel regions 110a. For example, in the present embodiment, the pixel electrodes 132 are more adjacent to the display medium 300 than the common electrode layer 190, thus, the pixel electrodes 132 have the openings 132a, and the openings 132a of the pixel electrodes 132 are located over the common electrode layer 190 (or over the touch sensing pads 192). However, the invention is not limited thereto, in an embodiment which is not shown, the common electrode layer may be more adjacent to the display medium than the pixel electrodes, thus, the common electrode layer 190 has the openings 132a, and the openings 132a of the common electrode layer 190 may also be located over the pixel electrodes 132 in each of the sub-pixel regions 110a. When the display panel 1000 is operated in a display mode (or referred to as in a display period), the display medium 300 may be driven by a potential difference between the common electrode layer 190 and the pixel electrode layer 130, so as to enable the display panel 1000 to display an image.

In the present embodiment, the pixel electrode layer 130 and the common electrode layer 190 may be selectively disposed on the same substrate (e.g., the first substrate 110) and are both located between the first substrate 110 and the display medium 300, and the display panel 1000 is, for example, a fringe-field switching (FFS) mode display panel. However, the invention is not limited thereto. In another embodiment, the pixel electrode layer 130 and the common electrode layer 190 may also be disposed on the same substrate, but the display panel 1000 may be an in-plane switching (IPS) mode display panel or other adaptive modes. In yet another embodiment, the pixel electrode layer and the common electrode layer may be selectively disposed on the first substrate 110 and the second substrate 200 respectively, and the display panel 1000 may be a Twisted Nematic (TN) mode, a super twisted nematic (STN) mode, a vertical alignment (VA) mode, a polymer sustained alignment (PSA) mode, an optically compensated birefringence (OCB) mode or other adaptive modes.

Referring to FIG. 1, FIG. 3 and FIG. 4, it is to be noted that the first spacer 152 is disposed over the active element layer 120 and the auxiliary conductive layer 140 and overlaps the auxiliary conductive layer 140 in the normal projection direction z. In other words, the first spacer 152 overlaps one of the touch lines TL in the normal projection direction z. The second spacer 154 is disposed on the active element layer 120 and does not overlap the auxiliary conductive layer 140 in the normal projection direction z. In the present embodiment, a height h1 of the first spacer 152 is equal or close to a height h2 of the second spacer 154. However, as the first spacer 152 may be boosted by the auxiliary conductive layer 140, while the second spacer 154 may be not boosted by the auxiliary conductive layer 140 in a normal condition (e.g., both the first spacer 152 and the second spacer 154 are not deformed due to the display panel 1000 being excessively pressed), a distance D1 between an apex 152a of the first spacer 152 and the first substrate 110 is greater than a distance D2 between an apex 154a of the second spacer 154 and the first substrate 110. The apex 152a of the first spacer 152 is higher than the apex 154a of the second spacer 154. In other words, a stacking structure of the first spacer 152 and a part of the auxiliary conductive layer 140 (e.g., the third extension portions 146) may be considered as a main spacer of a cell gap supporting between the pixel array substrate 100 and the second substrate 200, and the second spacer 154 may be considered as a sub spacer.

Furthermore, in a normal condition (e.g., both the first spacer 152 and the second spacer 154 are not deformed due to the display panel 1000 being excessively pressed), the apex 152a of the first spacer 152 may abut against the second substrate 200, and the apex 154a of the second spacer 154 may keep a distance from the second substrate 200 without contacting the second substrate 200. However, the invention is not limited thereto, in a specific condition (e.g., both the first spacer 152 and the second spacer 154 are deformed due to the display panel 1000 being excessively pressed), the apex 152a of the first spacer 152 and the apex 154a of the second spacer 154 may both abut against the second substrate 200. However, when the specific condition is precluded, for example, both the first spacer 152 and the second spacer 154 may not be permanently deformed due to elastic fatigue (that is, the first spacer 152 and the second spacer 154 are not damaged), the distance D1 between the apex 152a of the first spacer 152 and the first substrate 110 may be still greater than the distance D2 between the apex 154a of the second spacer 154 and the first substrate 110.

Referring to FIG. 1 and FIG. 3, in the present embodiment, the first spacer 152 may be disposed above the active element T and the third extension portion 146 of the auxiliary conductive layer 140. Referring to FIG. 1 and FIG. 4, each of the first extension portions 142 of the auxiliary conductive layer 140 may have a break point 142a, and the break point 142a may overlap another active element T. The second spacer 154 may be located above aforementioned another active element T and the break point 142a, without overlapping the auxiliary conductive layer 140. However, the invention is not limited thereto, and in other embodiments, the first spacer 152 and/or the second spacer 154 may be disposed at other suitable positions, and the first spacer 152 and/or the second spacer 154 do not have to overlap the active element T.

Referring to FIG. 1, in the present embodiment, the pixel array substrate 100 further includes a light-shielding pattern layer 156. The light-shielding pattern layer 156 is disposed on the auxiliary conductive layer 140. The first spacer 152 and the second spacer 154 are located between the second substrate 200 and the light-shielding pattern layer 156. The light-shielding pattern layer 156 is located between the first spacer 152 and the auxiliary conductive layer 140. For example, in the present embodiment, the light-shielding pattern layer 156 may be disposed on the insulation layer 194, and a part of the light-shielding pattern layer 156 is located between the first spacer 152 and the insulation layer 194 and between the second spacer 154 and the insulation layer 194. In the present embodiment, the first spacer 152 and the second spacer 154 may be disposed on the light-shielding pattern layer 156 and directly connected with the light-shielding pattern layer 156. For example, in the present embodiment, a patterned light-shielding material layer with a half-tone photo mask (which is not shown) is used to simultaneously form the first spacer 152, the second spacer 154 and the light-shielding pattern layer 156. In comparison with the patterning process using the tri-tone photo mask, a patterning process using the half-tone photo mask in the present embodiment is relatively mature and is capable of forming the first spacer 152, the second spacer 154 and the light-shielding pattern layer 156 with preferable heights and small variances, which contributes to mass production of the display panel 1000. In the present embodiment, the first spacer 152, the second spacer 154 and the light-shielding pattern layer 156 are integrally formed, and the first spacer 152, the second spacer 154 and the light-shielding pattern layer 156 may be made of the same light-shielding material, for example, a black photoresist material or the like, but the invention is not limited thereto.

Referring to FIG. 2, FIG. 3 and FIG. 4, in the present embodiment, the light-shielding pattern layer 156 is used to at least shield the scan lines GL. For example, in the present embodiment, the light-shielding pattern layer 156 may completely shield the scan lines GL, but incompletely shield the data lines DL. To be specific, the light-shielding pattern layer 156 may shield a part of the data lines DL (e.g., a part of the source S of the data lines DL), without shielding the other parts of the data lines DL. In other words, the light-shielding pattern layer 156 may be selectively not overlap a part DL-1 of the data lines DL, a normal projection of the part DL-1 of the data lines DL which do not overlap the light-shielding pattern layer 156 on the first substrate 110 is located between two normal projections of two adjacent scan lines GL on the first substrate 110. In brief, as illustrated in FIG. 2, in the present embodiment, based on the consideration of optimizing an aperture, the light-shielding pattern layer 156 may have a lateral portion shielding the scan lines GL, the active elements T and the openings 190a, but not a longitudinal portion capable of completely shielding the data lines DL. However, the invention is not limited thereto, and in other embodiments, the light-shielding pattern layer 156 may also have both the lateral portion and the longitudinal portion respectively shielding the scan lines GL and the data lines DL.

Figure 5:
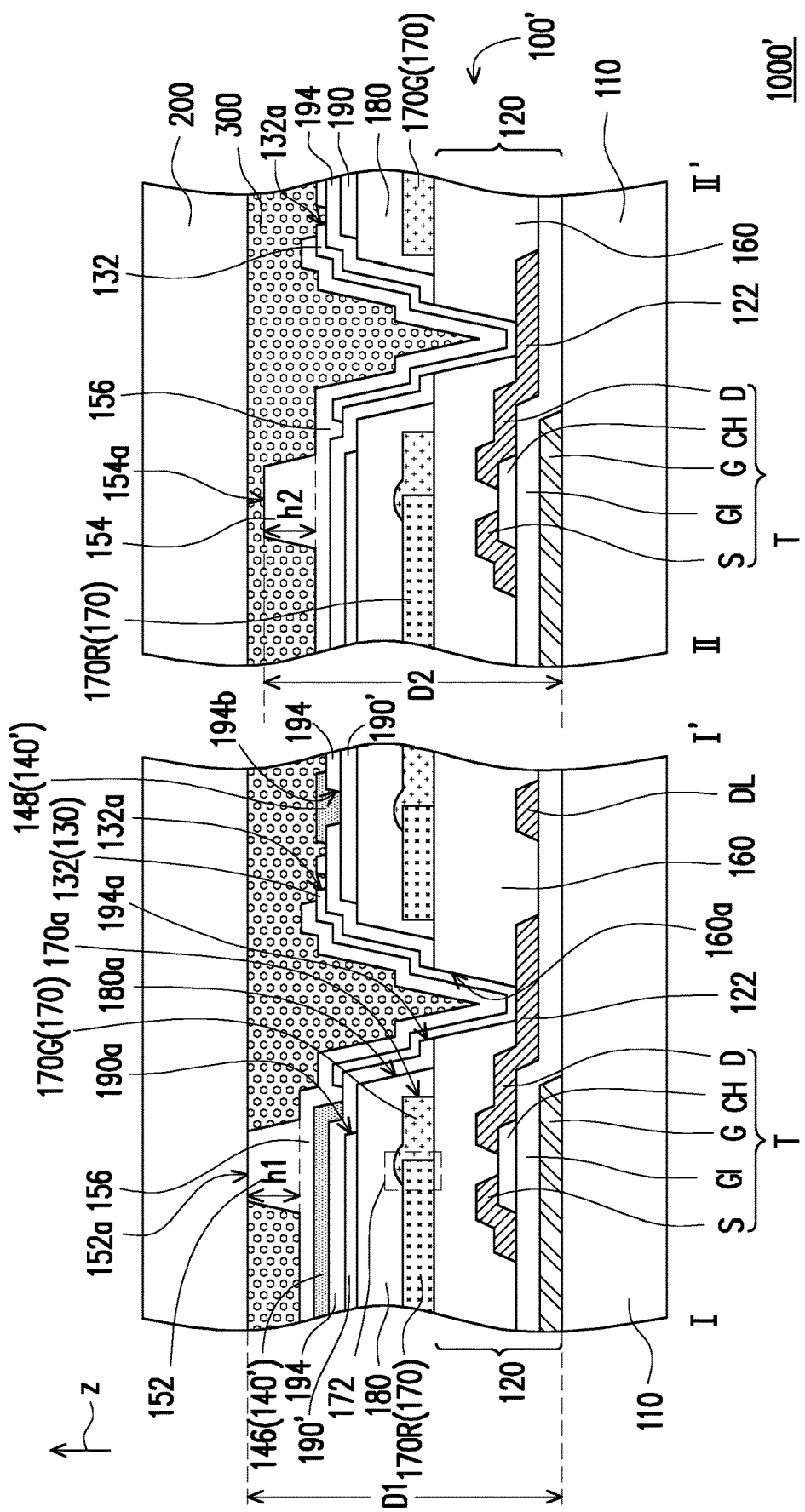
FIG. 5 is a schematic cross-sectional view of a display panel according to another embodiment of the invention.
Figure 6:
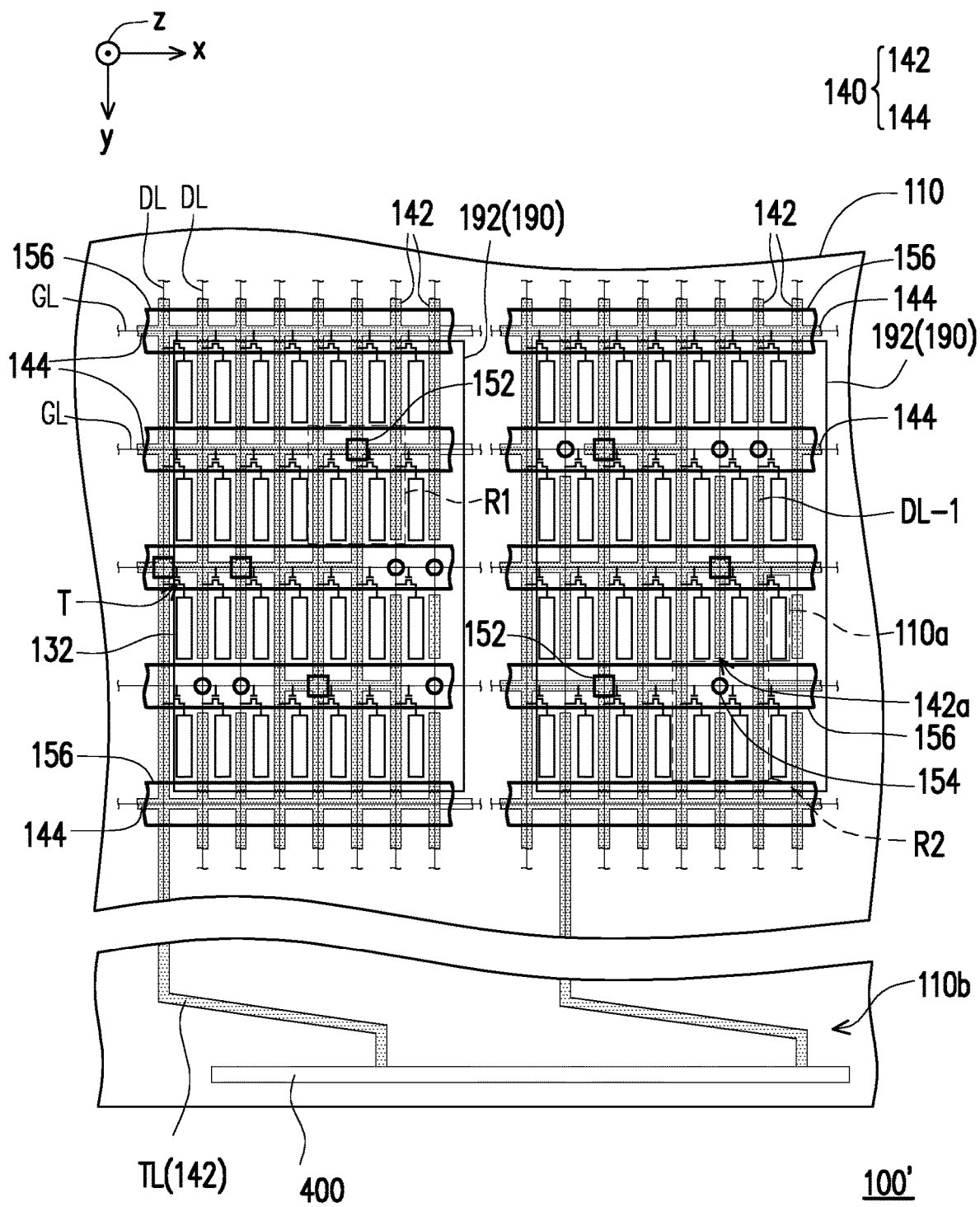
FIG. 6 is a schematic top view of a pixel array substrate illustrated in FIG. 5.
Figure 7:
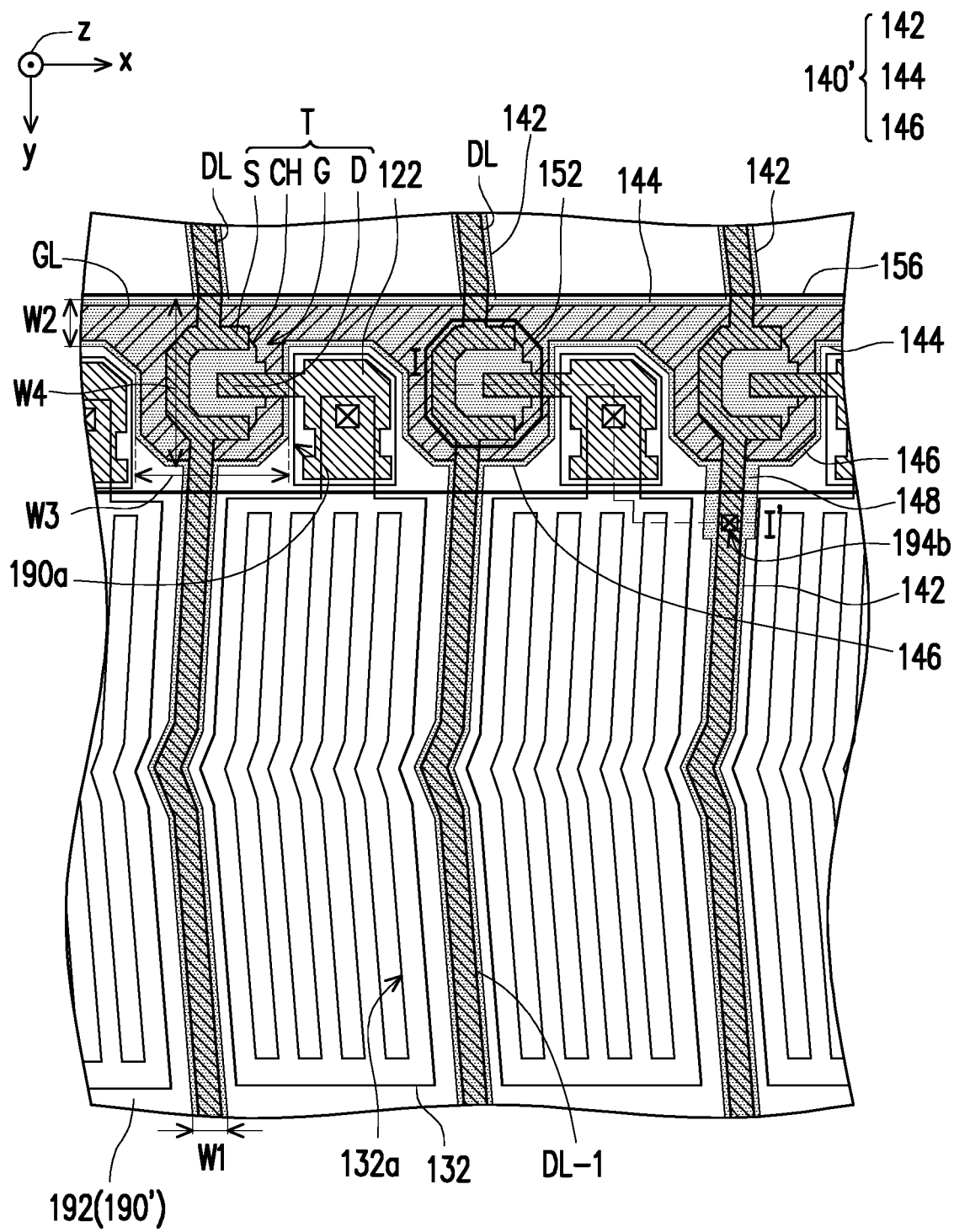
FIG. 7 is a schematic top view of a layout of a part of the pixel array substrate according to another embodiment of the invention.
Figure 8:
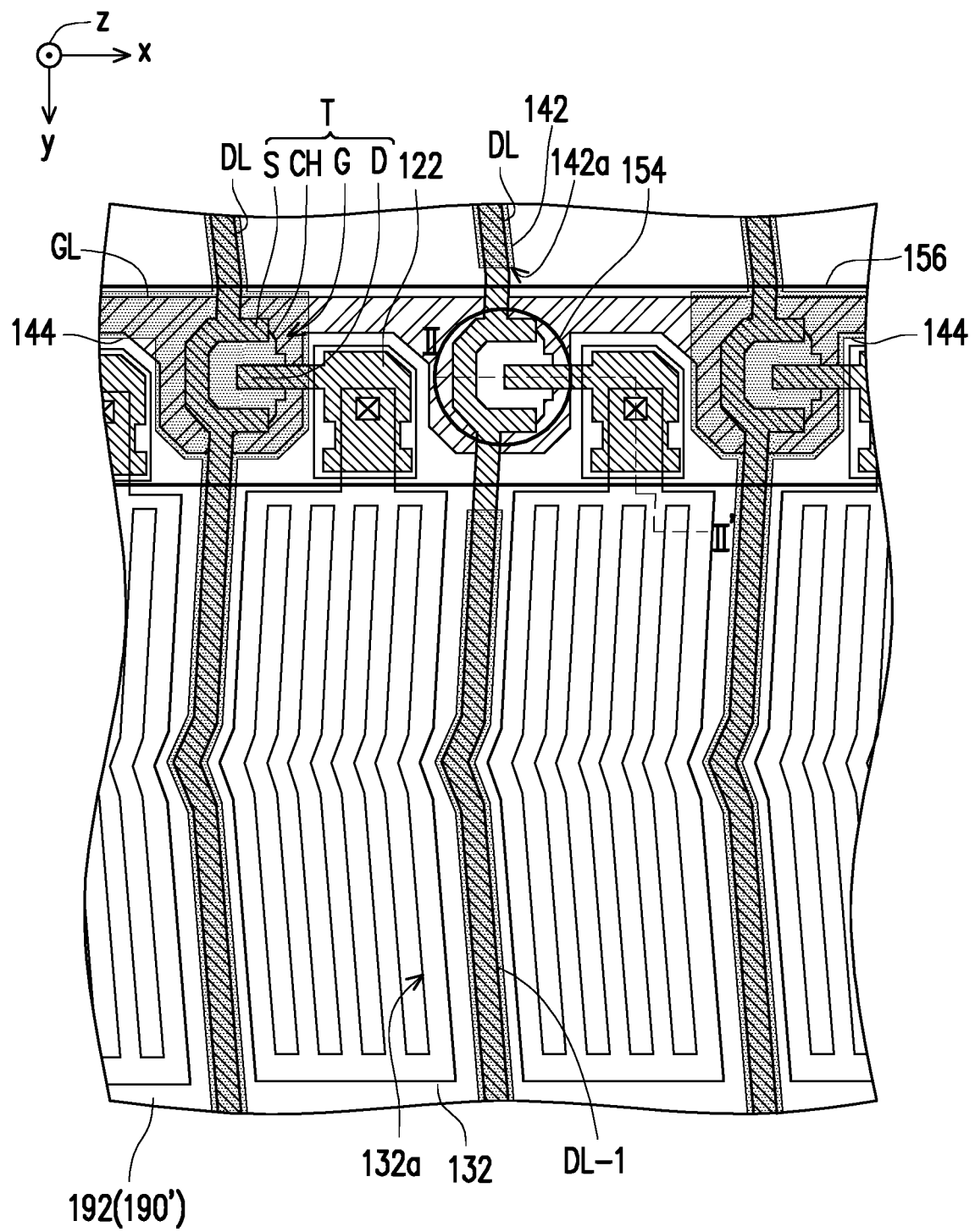
FIG. 8 is a schematic top view of a layout of a part of the pixel array substrate according to another embodiment of the invention.

FIG. 5 is a schematic cross-sectional view of a display panel according to another embodiment of the invention. FIG. 6 is a schematic top view of a pixel array substrate illustrated in FIG. 5. For the sake of clarity, the illustration of a color filter layer 170 depicted in FIG. 5 is omitted in FIG. 6. FIG. 7 is a schematic top view of a layout of a part of the pixel array substrate according to another embodiment of the invention. Specifically, FIG. 7 corresponds to a region R1 in FIG. 6 where a first spacer 152 is located, and FIG. 5 shows a schematic cross-sectional view along line I-I' of FIG.7. FIG. 8 is a schematic top view of a layout of a part of the pixel array substrate according to another embodiment of the invention. Specifically, FIG. 8 corresponds to a region R2 in FIG. 6 where a second spacer 154 is located, and FIG. 5 shows a schematic cross-sectional view along line II-II' of FIG.8.

Referring to FIG. 5 to FIG. 8, a display panel 1000' of the present embodiment is similar to the display panel 1000 described above, and thus, the same or similar elements may be represented by the same or similar reference numbers. The display panel 1000' includes a pixel array substrate 110'. The pixel array substrate 110' includes a first substrate 110, an active element layer 120, a pixel electrode layer 130, an auxiliary conductive layer 140', a first spacer 152 and a second spacer 154. The active element layer 120 is disposed on the first substrate 110. The pixel electrode layer 130 is disposed on the first substrate 110 and electrically connected with the active element layer 120. The auxiliary conductive layer 140' is disposed on the active element layer 120. The first spacer 152 is disposed on the auxiliary conductive layer 140'. The first spacer 152 overlaps the auxiliary conductive layer 140' in the normal projection direction z. The second spacer 154 is disposed on the active element layer 120. The second spacer 154 does not overlap the auxiliary conductive layer 140' in the normal projection direction z. A distance D1 between an apex 152a of the first spacer 152 and the first substrate 110 is greater than a distance D2 between an apex 154a of the second spacer 154 and the first substrate 110.

Being different from the display panel 1000 described above, a film layer order of the auxiliary conductive layer 140' and the common electrode layer 190' of the display panel 1000' is different from that of the auxiliary conductive layer 140 and the common electrode layer 190 of the display panel 1000. To be specific, as illustrated in FIG. 5, in the present embodiment, the common electrode layer 190' is located between the auxiliary conductive layer 140' and the active element layer 120. To be specific, in the present embodiment, the insulation layer 194 covers the common electrode layer 190' and has openings 194b. The auxiliary conductive layer 140' is disposed on the insulation layer 194 and filled in the openings 194b, so as to be electrically connected with the common electrode layer 190'. Referring to FIG. 5 and FIG. 7, for example, in the present embodiment, the auxiliary conductive layer 140' may have fourth extension portions 148 extending outward from the third extension portions 146. The openings 194b of the insulation layer 194 may be selectively disposed over the data lines DL, and the fourth extension portions 148 of the auxiliary conductive layer 140' may be filled in the openings 194b located over the data lines DL, such that the auxiliary conductive layer 140' may be electrically connected with the common electrode layer 190'. However, the invention is not limited thereto, and in other embodiments, the auxiliary conductive layer 140' and the common electrode layer 190' may also be electrically connected with each other through the openings 194b disposed at other adaptive positions. The display panel 1000' has effects and advantages similar to those of the display panel 1000 and thus, will not be repeatedly described.

Figure 9:
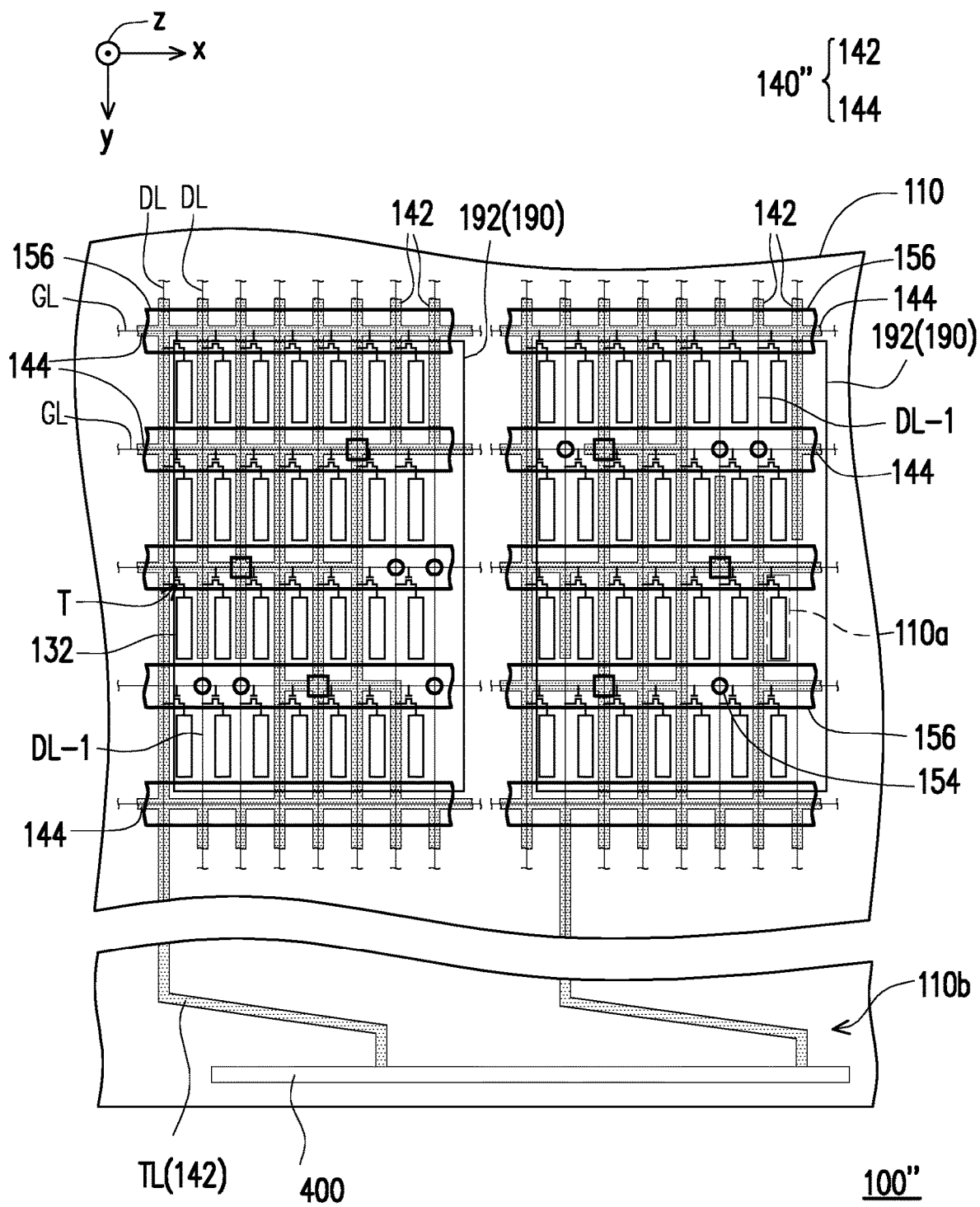
FIG. 9 is a schematic top view of a layout of a pixel array substrate of a display panel according to yet another embodiment of the invention.

FIG. 9 is a schematic top view of a layout of a pixel array substrate of a display panel according to yet another embodiment of the invention. A pixel array substrate 100" illustrated in FIG. 9 is similar to the pixel array substrate 100 illustrated in FIG. 2, thus, the same or similar elements may be represented by the same or similar reference numbers, and the difference between the two embodiments lies in that an auxiliary conductive layer 140" of the pixel array substrate 100" of the present embodiment is different from the auxiliary conductive layer 140 of the pixel array substrate 100. To be specific, in the embodiment illustrated in FIG. 2, except for a place where the second spacer 154 is disposed, the auxiliary conductive layer 140 almost cover all the data lines DL and the scan lines GL. In the embodiment illustrated in FIG. 9, a normal projection of a part DL-1 of the data lines DL which do not overlap the light-shielding pattern layer 156 on the first substrate 110 is located between two normal projections of two adjacent scan lines GL on the first substrate 110, and the auxiliary conductive layer 140" may not cover a part DL-1 of at least one of the data lines DL.

Additionally, it should be mentioned that shapes of the first spacer 152 and the second spacer 154 illustrated in FIG. 1 to FIG. 9 are only for exemplarily describing the embodiments of the invention, instead of construing limitations to the invention, and the shapes of the first spacer 152 and the second spacer 154 may be designed based on actual demands.

In light of the foregoing, the pixel array substrate of the display panel according to one of the embodiments of the invention includes the first substrate, the active element layer, the pixel electrode layer, the auxiliary conductive layer, the first spacer and the second spacer. The first spacer and the second spacer are both disposed on the active element layer. The first spacer overlaps the auxiliary conductive layer in the normal projection direction. The second spacer does not overlap the auxiliary conductive layer in the normal projection direction. In this way, even the height of the first spacer is substantially equal to the height of the second spacer, the distance between the apex of the first spacer and the first substrate is greater than the distance between the apex of the second spacer and the first substrate. The stacking structure of the first spacer and the auxiliary conductive layer may be considered as main spacer for maintaining the cell gap, and the second spacer may be considered as the sub spacer. Because the fabrication process of forming the auxiliary conductive layer, the first spacer and the second spacer is mature and stable, which leads the display panel to be subject to mass production.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A display panel, comprising:
   a first substrate;
   an active element layer, disposed on the first substrate;
   a pixel electrode layer, disposed on the first substrate and electrically connected with the active element layer;
   an auxiliary conductive layer, disposed on the active element layer;
   a first spacer, disposed on the auxiliary conductive layer, wherein the first spacer overlaps the auxiliary conductive layer in a normal projection direction;
   a second spacer, disposed on the active element layer, wherein the second spacer does not overlap the auxiliary conductive layer in the normal projection direction,
   a common electrode layer, disposed on the first substrate and between the first spacer and the active element layer; and
   an insulation layer, disposed between the pixel electrode layer and the common electrode layer, wherein the pixel electrode layer has a plurality of pixel electrodes, the common electrode layer has a plurality of common electrodes, and the pixel electrodes overlap the common electrodes, wherein one of each of the pixel electrodes and its corresponding common electrode has a plurality of openings,
   wherein a distance between an apex of the first spacer and the first substrate is greater than a distance between an apex of the second spacer and the first substrate.

2. The display panel as recited in claim 1, wherein the auxiliary conductive layer includes a plurality of touch lines, and the first spacer overlaps one of the touch lines in the normal projection direction.

3. The display panel as recited in claim 2, further comprising:
   a touch electrode layer, disposed on the first substrate and having a plurality of touch sensing pads which are separated from one another, wherein the pixel electrode layer has a plurality of pixel electrodes which are separated from one another, the touch sensing pads overlap the pixel electrodes in the normal projection direction, and the touch lines are electrically connected with the touch sensing pads.

4. The display panel as recited in claim 3, wherein the touch electrode layer is a common electrode layer.

5. The display panel as recited in claim 4, further comprising:
an insulation layer, disposed between the pixel electrode layer and the common electrode layer, wherein one of any the pixel electrode and its corresponding common electrode layer has a plurality of openings.

6. The display panel as recited in claim 3, wherein the touch electrode layer is located between the auxiliary conductive layer and the active element layer.

7. The display panel as recited in claim 3, wherein the auxiliary conductive layer is located between the touch electrode layer and the active element layer.

8. The display panel as recited in claim 1, wherein the active element layer comprises:
a plurality of active elements;
a plurality of data lines and a plurality of scan lines, intersecting with each other and electrically connected with the active elements, wherein the auxiliary conductive layer comprises a plurality of first extension portions and a plurality of second extension portions, the first extension portions overlap the data lines in the normal projection direction, and the second extension portions overlaps the scan lines in the normal projection direction.

9. The display panel as recited in claim 8, wherein the first extension portions and the second extension portions are connected, and one of the first extension portions or one of the second extension portions has a break point, and the second spacer is disposed above the break point.

10. The display panel as recited in claim 1, wherein the auxiliary conductive layer is electrically connected with the common electrode layer.

11. The display panel as recited in claim 1, wherein the auxiliary conductive layer is located between the common electrode layer and the active element layer.

12. The display panel as recited in claim 1, wherein the common electrode layer is located between the auxiliary conductive layer and the active element layer.

13. The display panel as recited in claim 1, wherein a material of the first spacer and the second spacer comprises a light-shielding photoresist material.

14. The display panel as recited in claim 1, wherein the active element layer comprises:
a plurality of active elements;
a plurality of data lines and a plurality of scan lines, intersecting with each other and electrically connected with the active elements, and the display panel further comprising:
a light-shielding pattern layer, used to at least shield the scan lines and disposed on the auxiliary conductive layer, wherein the first spacer and the second spacer are disposed on the light-shielding pattern layer and directly connected with the light-shielding pattern layer.

15. The display panel as recited in claim 14, further comprising:
a second substrate, disposed opposite to the first substrate; and
a display medium, disposed between the first substrate and the second substrate, wherein the first spacer and the second spacer are located between the second substrate and the light-shielding pattern layer, and the light-shielding pattern layer is located between the first spacer and the auxiliary conductive layer.

16. The display panel as recited in claim 14, wherein a material of the first spacer, a material of the second spacer and a material of the light-shielding pattern layer are the same light-shielding photoresist material.

17. The display panel as recited in claim 14, wherein the light-shielding pattern layer does not overlap a part of each of the data lines, and a normal projection of the part of each of the data lines on the first substrate is located between two normal projections of two adjacent scan lines on the first substrate.

18. The display panel as recited in claim 1, further comprising:
a color filter layer, disposed on the first substrate and located between the pixel electrode layer and the first substrate.

19. The display panel as recited in claim 1, wherein a material of the auxiliary conductive layer comprises molybdenum (Mo), aluminum (Al), copper (Cu), molybdenum nitride (MoN) or titanium (Ti).

* * * * *